(12) United States Patent
Chong et al.

(10) Patent No.: US 7,382,809 B2
(45) Date of Patent: Jun. 3, 2008

(54) TUNABLE FIBER LASER LIGHT SOURCE

(75) Inventors: Changho Chong, Kasugai (JP);
Atsushi Morosawa, Kasugai (JP);
Tooru Sakai, Inuyama (JP)

(73) Assignee: Santec Corporation, Komaki City (JP)

( * ) Notice: Subject to any disclaimer, the term of this patent is extended or adjusted under 35 U.S.C. 154(b) by 509 days.

(21) Appl. No.: 11/113,102

(22) Filed: Apr. 25, 2005

(65) Prior Publication Data
US 2006/0193352 A1    Aug. 31, 2006

(30) Foreign Application Priority Data
Feb. 25, 2005    (JP) .............................. 2005-051105

(51) Int. Cl.
*H01S 3/10* (2006.01)
*H01S 3/08* (2006.01)
(52) U.S. Cl. ................... 372/20; 372/100; 372/102
(58) Field of Classification Search .............. 372/20, 372/102
See application file for complete search history.

(56) References Cited
U.S. PATENT DOCUMENTS 6,160,826 A * 12/2000 Swanson et al. ............ 372/20
6,853,457 B2 * 2/2005 Bjarklev et al. ............ 356/497
2003/0174327 A1 * 9/2003 Tayebati .................... 356/328
2005/0035295 A1 * 2/2005 Bouma et al. ............ 250/341.1
2005/0231651 A1 * 10/2005 Myers et al. ............... 348/744
2006/0203859 A1 * 9/2006 Cable et al. ................. 372/20

OTHER PUBLICATIONS

Yamashita, S. et al., Widely Tunable Erbium-Doped Fiber Ring Laser Covering Both C-Band and L-Band, IEEE Journal on Selected Topics in Quantum Electronics, Jan./Feb. 2001, pp. 41-43, , vol. 7, No. 1.

* cited by examiner

*Primary Examiner*—Minsun Harvey
*Assistant Examiner*—Phillip Nguyen
(74) *Attorney, Agent, or Firm*—Smith Patent Office

(57) ABSTRACT

An optical fiber loop has a gain medium having a gain at an oscillation wavelength and optical circulators 13 and 14. Collimate lenses 22 and 24 enlarge light bean taken from the optical circulators 13 and 14. A polygon mirror 25 is provided on the light axis, and is rotated. A diffraction grating 27 is provided at the receiving position of the light reflected by the polygon mirror 25, and is of a Littrow configuration which reflects the light in the same direction as the incident light. A selected wavelength changes according to an incident angle to the diffraction grating 27, resulting in increase of selectivity owing to twice incident, thereby permitting to change an oscillation wavelength with narrow band even when changing the selected wavelength by rotating the polygon mirror 25 at high speed.

21 Claims, 14 Drawing Sheets

F I G. 2
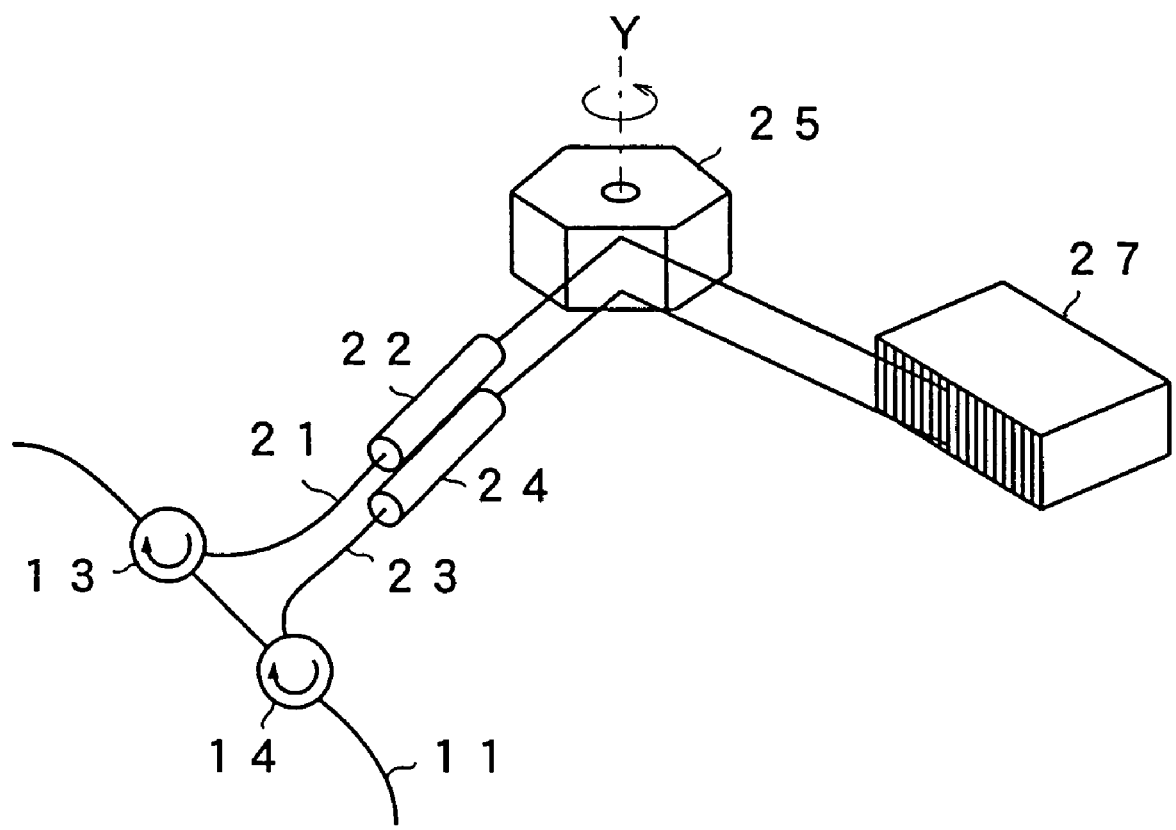

F I G. 6
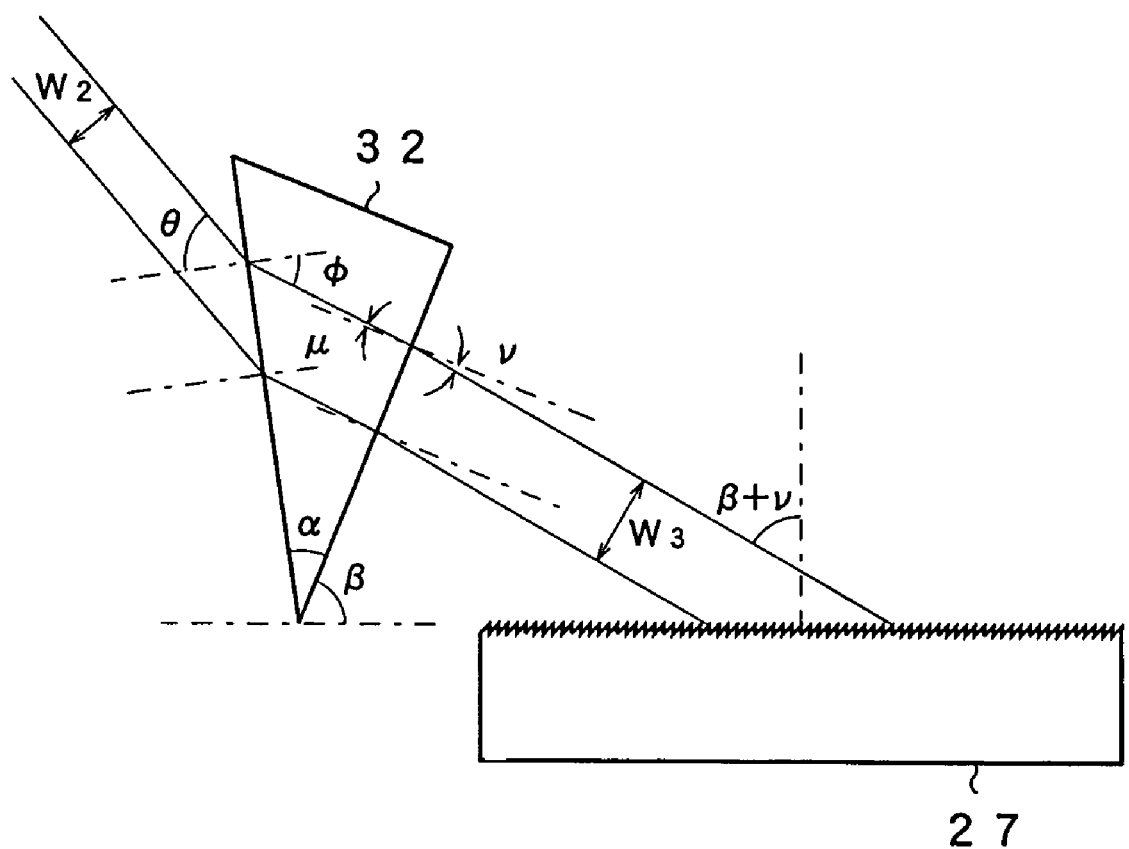

FIG. 7

| | | | | |
|---|---|---|---|---|
| $\alpha$ | ° | 30.0 | 30.0 | 30.0 |
| $\theta$ | ° | 55.0 | 57.5 | 60.0 |
| $\phi$ | ° | 34.129 | 35.287 | 36.382 |
| $\mu$ | ° | −4.129 | −5.287 | −6.382 |
| $\nu$ | ° | −6.035 | −7.731 | −9.340 |
| $\beta$ | ° | 68.000 | 68.000 | 68.000 |
| $\beta+\nu$ | ° | 61.97 | 60.27 | 58.66 |
| M2 | | 1.439 | 1.512 | 1.599 |
| a | lines/mm | 1100 | 1100 | 1100 |
| W2 | m | 0.00060 | 0.00060 | 0.00060 |
| W3 | m | 0.00086 | 0.00091 | 0.00096 |
| $\lambda$ | nm | 1604.841 | 1578.846 | 1552.902 |
| $\Delta f$ | GHz | 29.45 | 30.06 | 30.31 |

F I G. 1 5
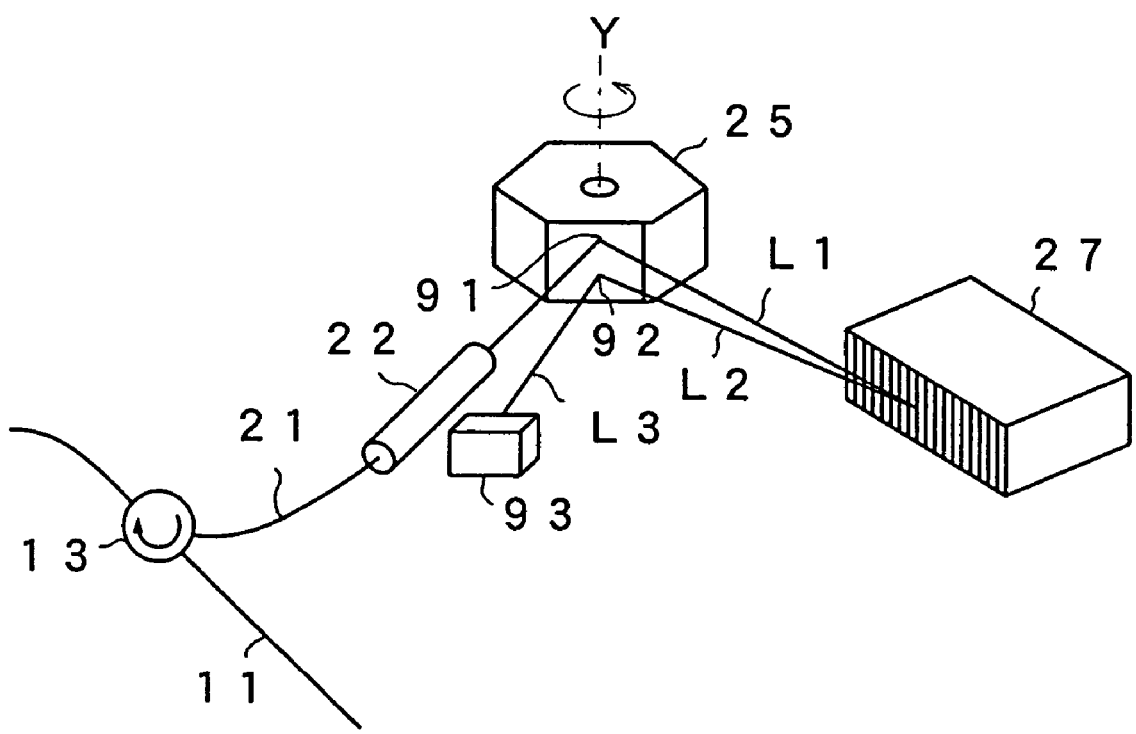

TUNABLE FIBER LASER LIGHT SOURCE

BACKGROUND OF THE INVENTION

1. Field of the Invention

The present invention relates to a tunable fiber laser light source, which generates monochromatic light to periodically scan an emission wavelength thereof.

2. Discussion of the Related Art

Hitherto, as a light source of an analyzer for analyzing an object to be measured by irradiating the object with light, a light source of a wide bandwidth is used. In spectral analysis, there is widely used a method of projecting light of a wide bandwidth to an object to be measured, spatially decomposing reflection light or transmission light of the projected light to wavelength components by a grating or the like, Fourier-analyzing the frequency components by an interferometer, and making an analysis. As a light source used in such a method, for example, a white light source, an ASE light source using an erbium doped fiber (EDF), or the like is used. In such spectral analysis, however, the intensity and density of the light from the light source with respect to the wavelength is low, and those of light which is used in spectral analysis is also low. Consequently, the light source has a drawback such that even if Fourier transformation is performed, a light signal cannot be detected due to noise, and it is difficult to carry out the analysis.

Another method uses, as the light source of the analyzer, a tunable light source for emitting light of a single spectrum of high power density which is changed in a desired bandwidth. The light source emits a strong single spectrum light beam to an object to be measured while changing the wavelength of the light beam, so that the light beam passes through the object or reflection light of the light beam is directly received by a light detecting element. In the method, the intensity and density of the optical output with respect to the wavelength of the light source is high, so that the level of detected light and a S/N ratio are sufficiently high and sufficiently high measurement precision can be realized.

Conventional tunable light source includes an external cavity-type laser and fiber ring laser. The external cavity-type laser uses a gain medium such as a semiconductor laser. An external cavity is formed between one of end faces of the semiconductor laser and an external mirror, and a tunable filter formed by a grating or the like is provided in the external resonator, thereby changing the oscillation wavelength. In such a manner, a light source of the tunable type is obtained. In the external resonator-type laser light source, the length of the external resonator is relatively short as 50 mm, and the longitudinal mode interval is wide as 30 GHz. Therefore, when the wavelength of the tunable filter is simply changed, the output becomes unstable between the longitudinal modes. For example, between modes, discontinuous mode hopping occurs, or oscillation occurs in a multimode. Therefore, in order to vary the wavelength continuously in a single mode and to, moreover, make the output stable, the length of the external cavity has to be controlled finely by using such devices as a piezo-element and a complicated control is necessary. The control accompanies a mechanical operation and is performed by making the wavelength and the length of the external cavity synchronous. Consequently, the method has a drawback that it is difficult to change the wavelength at high speed.

YAMASHITA ET AL., IEEE JOURNAL ON SELECTED TOPICS IN QUANTUM ELECTRONICS, VOL. 7, NO. 1 JANUARY/FEBRUARY 2001, PP41~43 shows another conventional tunable light source of a ring laser using an erbium doped fiber. The tunable light source is obtained by using the erbium doped fiber (EDF) and a fiber amplifier for exciting the erbium doped fiber as a gain medium, providing a bandpass filter of a tunable type in the optical fiber loop, and changing the wavelength of the bandpass filter. In this case, the length of a resonator of the optical fiber loop can be set to be long such as 30 m, so that the interval between longitudinal mode can be narrowed. Consequently, without changing the length of the resonator, the influence of mode hopping can be eliminated. Thus, although it is, strictly, not single mode oscillation, virtually continuous wavelength change can be achieved only by changing the wavelength to be selected of the bandpass filter.

When a tunable light source is used as a light source for the analyzer, it is necessary to change a wavelength at high speed and to narrow a width of an oscillation spectrum. Therefore, a corresponding characteristic is demanded for a bandpass filter. In the optical coherent tomography (OCT), for example, when the high-speed wavelength scanning can be utilized, a dynamic analysis can be performed to a high-speed image processing, bloodstream observation, variation of an oxygen saturation concentration, and the like, wherein such an analyzer is desired. However, a tunable laser light source capable of performing the high-speed scanning in such a manner as to follow an image display frame rate has not been available so far.

In the conventional filter techniques, however, it is difficult to obtain both high-speed wavelength sweep and a high Q value at the same time. For example, a tunable filter using an acoustooptic effect has a drawback such that, due to an insufficient suppression ratio at wavelengths other than the transmission wavelength, stable oscillation cannot be performed. In the case of forming a Fabry-Perot etalon by using a piezo-element as a bandpass filter, the wavelength sweep speed is as low as a few Hz or less and the case has a problem of hysteresis. In the case of using a grating for the bandpass filter, there are drawbacks such that adjustment of the optical axis is difficult and the cost is high.

SUMMARY OF THE INVENTION

The present invention has been achieved to solve such drawbacks and its object is to provide a wavelength tunable fiber laser light source capable of scanning wavelength of a light source in a narrow bandwidth at high speed.

In order to achieve the above object, a tunable fiber laser light source of the present invention comprises: an optical fiber loop which serves as an optical path of laser oscillation; a gain medium which is connected to said optical fiber loop and has a gain with respect to an oscillating wavelength; a light branch incident section which divides a plurality of light from said optical fiber loop and returns light to said optical fiber loop through the same optical path as the divided light; a tunable optical filter which receives the plurality of divided light divided by said light branch incident section, selects with each same wavelength continuously changed, and supplies light of the selected wavelength to the light branch incident section through the same optical path; and an optical coupler which is connected to said optical fiber loop and takes out a part of light passing through said optical fiber loop, wherein said tunable optical filter includes: an optical beam deflector which changes a reflecting angle of an optical beam, obtained from said light branch incident section, periodically within a certain range; and a diffraction grating which receives light deflected by said optical beam deflector and reflects light of selected wavelength changing according to an incident angle in the same direction as the incident angle.

A tunable fiber laser light source of the present invention comprises: an optical fiber loop which serves as an optical path of laser oscillation; a gain medium which is connected to said optical fiber loop and has a gain with respect to an oscillating wavelength; a light branch incident section which divides light from said optical fiber loop, and returns light to said optical fiber loop through the same optical path as the divided light; a tunable optical filter which receives the divided light divided by said light branch incident section, selects with wavelength continuously changed, and supplies light of the selected wavelength to the light branch incident section through the same optical path; and an optical coupler which is connected to said optical fiber loop, and takes out a part of light passing through said optical fiber loop, wherein said tunable optical filter includes: an optical beam deflector which reflects optical beam obtained from said light branch incident section, and changes a reflecting angle of the optical beam periodically within a certain range with a central focus on a axis; a diffraction grating which receives the light deflected by said optical beam deflector passing through a first optical path, and reflects light of selected wavelength changing according to an incident angle, the reflecting light passing through a second optical path different from said the first optical path in the same direction seen from the axis of said optical beam deflector; and a mirror which reflects light reflected at said optical beam deflector passing through said second optical path and, then, inputted passing through a third optical path by return to the third optical path.

According to the present invention having such characteristics, an optical fiber loop is used as an optical path of laser oscillation to extend an optical path length and change an oscillation wavelength by means of a tunable filter. In the tunable filter, an optical beam deflector deflects light and inputs the light to a diffraction grating. The diffraction grating, used as a filter which varies in wavelength according to an incident angle, makes light reflective in the same direction as incident light. Consequently the tunable filter constitutes a part of the optical path, so that the oscillation wavelength can be determined in response to a selected wavelength of the filter. Then, continuous change of the incident angle to the diffraction grating results in continuous change of the selected wavelength of the tunable filter, thereby enabling the oscillation wavelength to change. Sufficiently high deflection velocity of the optical beam deflector permits wavelength scanning at high speed. A plurality of times of inputting light from the same direction at the diffraction grating can provide effects to keep band width narrow even when scanning wavelength at high speed and to obtain narrow band laser light.

BRIEF DESCRIPTION OF THE DRAWINGS

FIG. 2 is a perspective view showing an optical beam deflector and surrounding parts according to the embodiment;

FIG. 6 is an enlarged view showing a beam expander 32 and a diffraction grating 27;

FIG. 7 is a table showing angle variations and wavelength variations;

FIG. 15 is a perspective view showing an optical beam deflector and surrounding parts according to the eighth embodiment.

DESCRIPTION OF THE PREFERRED EMBODIMENTS

First Embodiment

Figure 1:
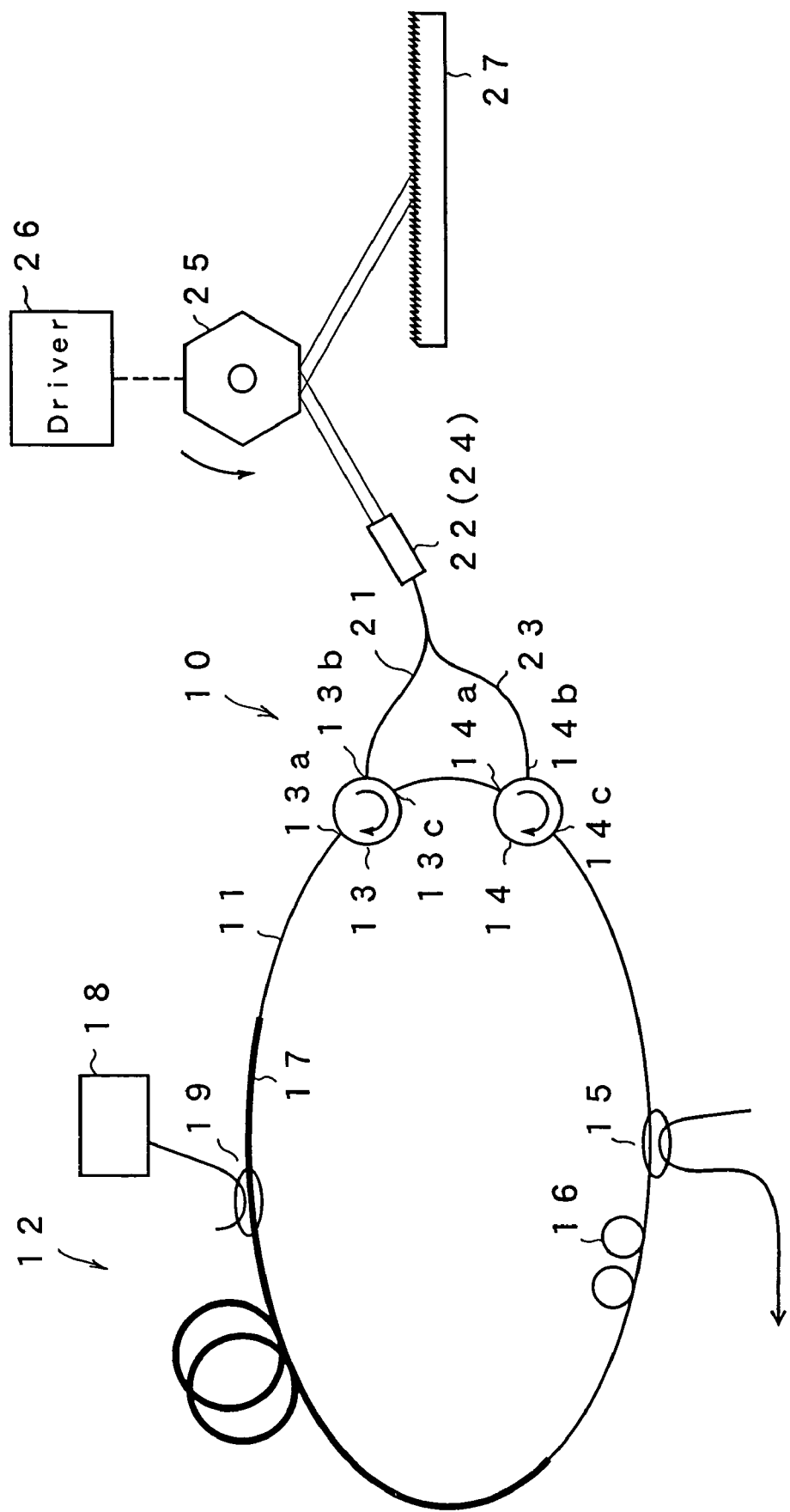
FIG. 1 is a schematic view showing a tunable fiber laser light source according to a first embodiment of the present invention.

FIG. 1 is a schematic view showing the configuration of a tunable fiber laser light source according to a first embodiment of the present invention. A tunable fiber laser light source 10 of this embodiment forms a loop by including an optical fiber 11. In a part of the loop, a gain medium 12, optical circulators 13 and 14, an optical coupler 15 and a polarization controller 16 are provided. The gain medium 12 has an erbium doped fiber 17 provided in a part of the optical fiber loop and doped with erbium ions ($Er^{3+}$), a semiconductor laser 18 for exciting the fiber for emitting pump light to the erbium doped fiber 17, and a WDM coupler 19. The wavelength bandwidth of the gain can be adjusted by selecting a material with which the erbium doped fiber is doped. The optical fiber loop has a length of, for example, 1 to 50 m. The semiconductor laser 18 for exciting has a wavelength of, for example, 1480 nm or 980 nm and amplifies light passing through the erbium doped fiber 17. The optical circulator 13 regulates the direction of light passing through the optical fiber 11 to the arrow direction as shown in the figure. Specifically, input terminals 13a and 13b of the optical circulator 13b are connected to the optical fiber loop and incident light from the input terminal 13a is emitted from a terminal 13b of the optical circulator 13. Incident light from the terminal 13b of the optical circulator 13 is emitted from the terminal 13c. Input terminals 14a and 14b of the optical circulator 14b are connected to the optical fiber loop and incident light from the input terminal 14a is emitted from a terminal 14b of the optical circulator 14. Incident light from the terminal 14b of the optical circulator 14 is emitted from the terminal 14c. The incident light from the terminal 14c is emitted from the terminal 14a. The optical coupler 15 extracts a part of light of the optical fiber loop, and the polarization controller 16 regulates the polarization state of light passing through the optical fiber loop to a predetermined state.

The terminal 13b of the optical circulator 13 is connected to a collimate lens 22 via an optical fiber 21 as shown in the figure. The terminal 14b of the optical circulator 14 is connected to a collimate lens 24 via an optical fiber 23 as shown in the figure. The collimate lenses 22 and 24 collimate light from each of the optical fibers 21 and 23 into parallel light, and a polygon mirror 25 with flat surfaces is provided on the optical axis. A driver 26 rotates the polygon mirror 25 along an axis perpendicular to a paper face, and the light reflected on the face of the polygon mirror is inputted into a diffraction grating 27. The diffraction grating 27 is a grating having a section with sawtooth waveform continuously formed at a constant pitch. Then, this embodiment constitutes a Littrow arrangement so that incident light returns, passing through the same optical path to a projection direction even if an incident direction changes, and a selected wavelength changes according to the incident angle. Here, the selected wavelength is set within a range from 1500 to 1600 nm, for example. The polygon mirror 25 and the driver 26 constitute an optical beam deflector which changes an angle of an optical beam periodically in a certain range. The optical beam deflector and the diffraction grating 27 constitute a tunable filter.

FIG. 2 is a perspective view showing a relationship between the collimate lens, polygon mirror and diffraction grating. As shown in the figure, if a rotation axis of the polygon mirror 25 is a Y-axis, light irradiated from each of the collimate lenses 22 and 24 is preferable to irradiate so as to adjoin in a Y-axis direction. This takes the light to be inputted into the diffraction grating 27 in the same angle and conform to wavelength selection characteristics. Accordingly, appropriate selection of a width in the Y-axis direction with respect to the polygon mirror 25 and diffraction grating 27 permits to keep the light passing through the collimate lenses 22 and 24 in the same wavelength selection characteristics.

The Littrow arrangement will be described. When the incident angle of the optical beam with respect to the diffraction grating is $\gamma$ and a reflection angle is $\delta$, diffracted light is obtained by the following expression.

$$\Lambda(\sin\gamma + \sin\delta) k\lambda \quad (1)$$

Herein, k is an order and takes values of $0, \pm 1, \pm 2 \ldots$. There are Littrow and Littmann arrangements in the diffracted light. In the Littrow arrangement, angles of the 1st order diffracted light and incident light are equal. Therefore, when $\gamma = \delta_{-1}$ in the expression (1), based on the expression (1), the wavelength of the diffracted light is determined by the following expression.

$$\lambda = 2\Lambda \sin\gamma \quad (2)$$

Herein, $\Lambda$ is a pitch (μm) of the grating, that is, an inverse number of the number of grating lines a (lines/mm) per unit length. The angles of the incident light and reflected light are not equal in the Littmann arrangement.

It is necessary to select, for a length of an optical fiber loop, such a length as to include a plurality of vertical modes in a full width at half maximum of a bandpass filter by means of the diffraction grating. The number of the vertical modes is preferably at least 10, more preferably at least 100, in fact, the more, the more preferable. However, it is necessary to extend the optical fiber in order to provide more vertical modes, which necessitates the use of an optical fiber having a length of several to tens of meters in practical use.

Figure 3:
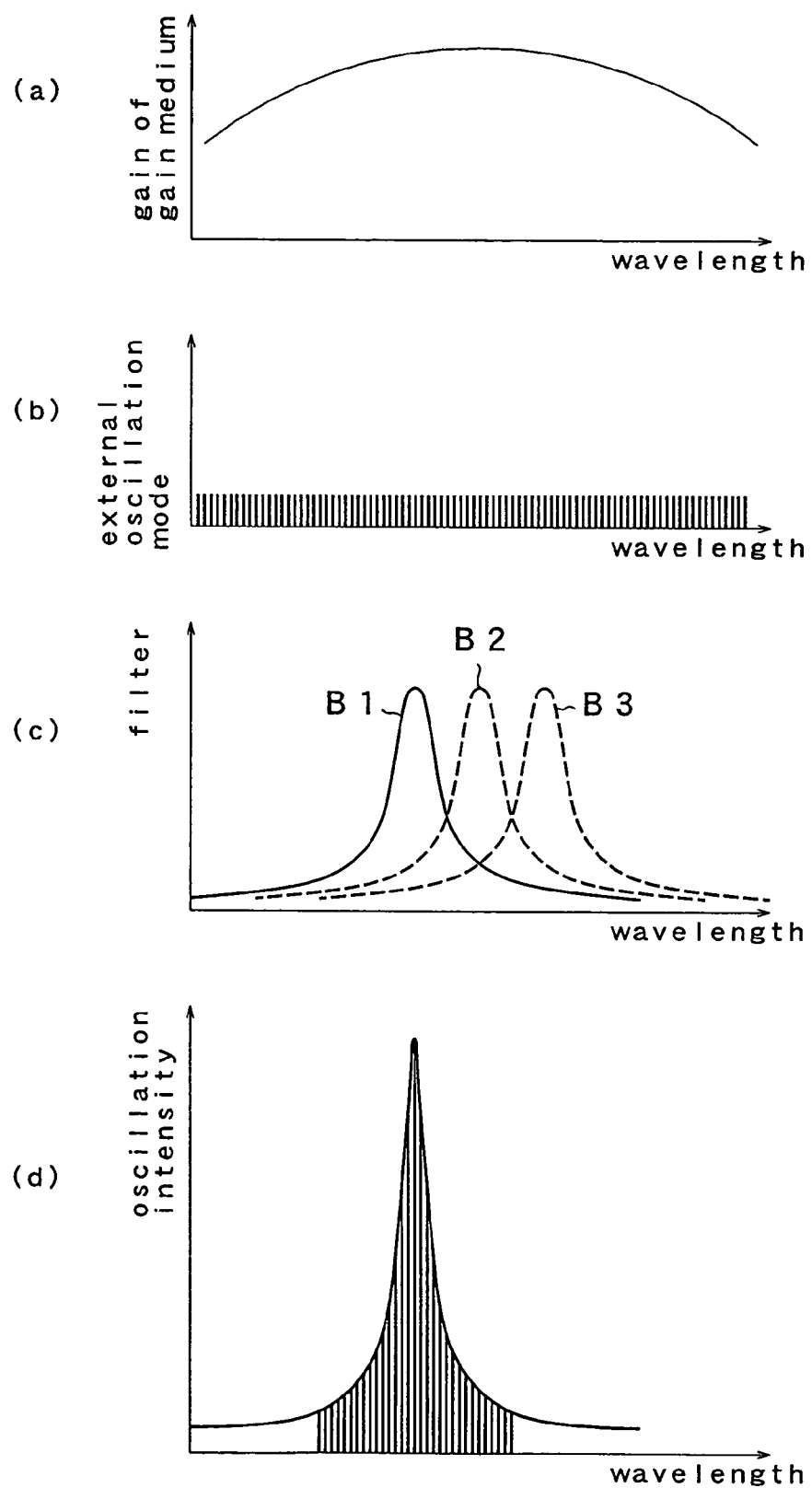
FIG. 3A is a graph showing a gain of a gain medium of an optical fiber laser light source according to the first embodiment.
FIG. 3B is a graph showing an oscillation mode.
FIG. 3C is a graph showing characteristics of a band path filter.
FIG. 3D is a graph showing an oscillation output.

Now, an operation of this embodiment will be described. The aforementioned semiconductor laser 18 for excitation is driven to provide pumping of an optical fiber loop via the WDM coupler 19. FIG. 3A shows a gain of the gain medium 12. Thus, operation of the optical circulator 13 causes light added from a terminal 13a to input into the optical fiber 21 from the terminal 13b, and then the collimate lens 22 collimates the light into parallel light. Then, the light reflected at an angle determined by a rotation angle of the polygon mirror 25 is added to the diffraction grating 27. The reflected light selected by the Littrow arrangement of the diffraction grating 27 is directly reflected in the same direction and is added to the collimate lens 22 via the polygon mirror 25. Further, the reflected light is added to the optical fiber loop from the optical circulator 13 via the collimate lens 22. In addition, operation of the optical circulator 14 causes light added from a terminal 14a to input into the optical fiber 23 from the terminal 14b, and then the collimate lens 24 collimates the light into parallel light. Then, the light reflected at an angle determined by a rotation angle of the polygon mirror 25 is added to the diffraction grating 27. The reflected light selected by the Littrow arrangement of the diffraction grating 27 is directly reflected in the same direction as it is, and is added to the collimate lens 24 via the polygon mirror 25. Further, the reflected light is added to the optical fiber loop by the optical circulator 14 via the collimate lens 24. A polarization controller 16 adjusts a polarization of the light transmitting through the optical fiber loop in a predetermined direction. FIG. 3B shows an external cavity vertical mode determined in accordance with an optical length decided by the length of the optical fiber loop and a refractive index of the optical fiber. For example, when the optical length is 30 m, intervals of the vertical modes becomes approximately 10 MHz. FIG. 3C shows a characteristic B1 of the diffraction grating 27. The diffraction grating 27 selects the light added twice from the collimate lenses 22 and 24 via the polygon mirror 25, thereby oscillating the light in a multiple mode with a plurality of vertical modes included as shown in FIG. 3D at the wavelength having characteristics that further includes characteristic B1 as a narrow band. The oscillation wavelength is, for example, 1550 nm. A part of the laser light thus oscillated in the optical fiber loop, for example, the light equivalent to 90% of the laser light is retrieved via the optical coupler 15. An optical signal of the multi-mode oscillation raises a problem when used as a light of optical wavelength division multiplexing communication. The optical signal, however, is acceptable as long as a spectral line width (to be strict, half-value width of an envelope of the spectrum at the time of the multi-mode oscillation) is sufficiently narrower than a resolution of a subject to be measured in the case of a spectral analysis, optical fiber sensing, evaluation of optical components. As a length of an optical fiber 11 is selected such a length that a plurality of modes, preferably at least 10 modes, more preferably at least 100 modes can stand in a full width at half maximum of the optical filter.

Figure 4:
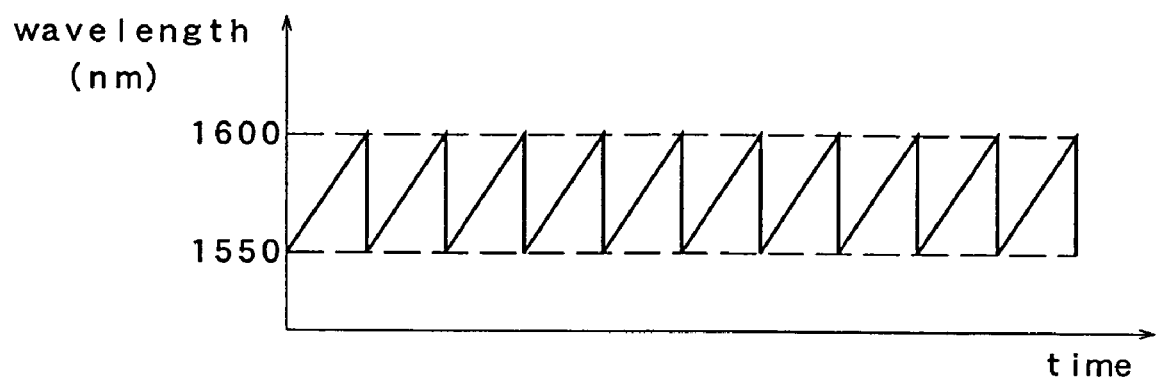
FIG. 4 is a graph showing a temporal change of an oscillation wavelength according to the embodiment.

Then, the driver 26 rotates the polygon mirror 25. This changes an incident angle to the diffraction grating 27, thereby changing the selected wavelength continuously as shown in from B1 to B3 in FIG. 3C. Therefore, rotation of polygon mirror 25 causes the oscillation wavelength to change into sawtooth waveform as shown in FIG. 4. In this case, the rotation of polygon mirror 25 permits the selected wavelength to change at high scanning velocity within a range of 50 nm, for example. For instance, if the rotation velocity of the polygon mirror 25 is 30000 rpm and the number of reflecting faces of the polygon mirror 25 is 12, the oscillation wavelength of the fiber laser light source changes at a scanning velocity of 15.4 KHz.

The oscillation according to this embodiment becomes an oscillation in the multiple mode manner as shown in FIG. 3D. Here, the intervals between the vertical modes are extremely narrow as shown in FIG. 3B, when a wavelength is changing, the oscillation mode is continuously shifted in an envelope shape. The wavelength can be thus continuously changed without mode hopping. The mode hopping, which causes unstable state of an output, is seen in a conventional semiconductor laser of an external cavity type for a single-mode oscillation. Further, when scanning at high speed, a central wavelength of the filter shifts on the long wavelength side according to a time that the light turns the entire optical fiber loop, and selecting characteristic broadens. In addition, an oscillation velocity of the suppressed vertical mode cannot follow the shift of wavelength; thus, an output spectrum broadens. However, in this embodiment, the light passes through the tunable filter twice, thereby allowing the bandwidth to keep narrow even when scanning at high speed.

Second Embodiment

Figure 5:
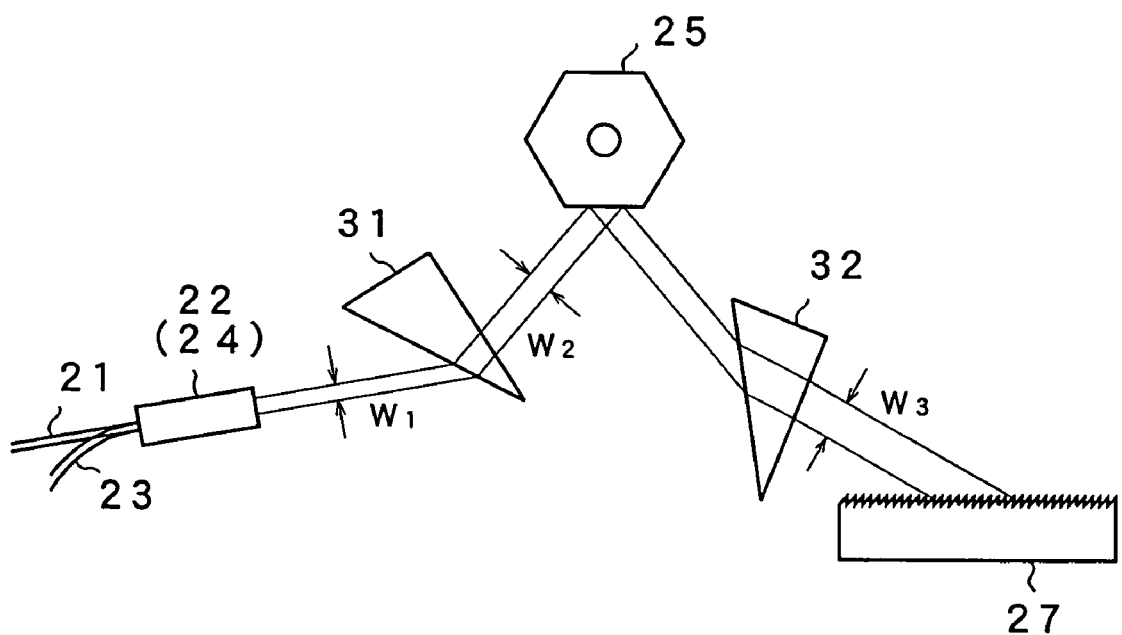
FIG. 5 is a schematic view showing a part of a tunable filter of a tunable fiber laser light source according to a second embodiment of the present invention.

Next, a second embodiment of the present invention will be described. There is no difference between the present embodiment and the first embodiment in terms of the optical fiber loop, and the structure from the circulator 13 to the optical fibers 21 and 22, and collimate lenses 23 and 24. In the present embodiment, an optical beam diameters of the light emitted from the collimate lenses 23 and 24 are expended as shown in FIG. 5. When a beam diameter of an optical beam from the collimate lenses 23 and 24 are $W_1$, the optical beam diameters are enlarged to $W_2$ by a beam expander 31 having a prism shape as shown in FIG. 5. The light reflected in the polygon mirror 25, the optical beam diameters of which are further enlarged to $W_3$ by a beam expander 32, is added to the diffraction grating 27. The optical beam diameters of the incident light with respect to the diffraction grating 27 can be thus enlarged.

FIG. 6 is an enlarged view of the beam expander 32 and the diffraction grating 27, wherein an incident angle and a refraction angle with respect to a first surface of the beam expander 32 are respectively θ and φ, and an incident angle and a refraction angle with respect to a second surface of the beam expander 32 are respectively ν and μ. An apex angle of a prism of the beam expander 32 is α, and the prism is disposed at an angle position of β relative to the diffraction grating 27. In this case, the incident angle with respect to the diffraction grating 27 is β+ν because of the refraction shown in the figure. A wavelength λ selected by the diffraction grating 27 is represented by the following expression.

$$\lambda = 2\Lambda \sin(\beta+\nu) \quad (3)$$

Herein, Λ is a pitch (μm) of the diffraction grating and an inverse number of a constant (lines/mm) of a diffraction grating constant a. A bandwidth in Full-Width-Half-Maximum (FWHM) Δλ of the wavelength selected by the diffraction grating is obtained by the following expression.

$$\Delta\lambda = \lambda^2/\{2\pi W \tan(\beta+\nu)\} \quad (4)$$

Herein, W is an optical beam diameter of the light added to the diffraction grating 27, and (β+ν) is an incident angle with respect to the diffraction grating. As is clear from the expression (3), the selected wavelength is longer as the incident angle is larger, while the small incident angle results in short wavelength. As shown in FIG. 6, when the incident angle is larger, the optical beam diameter projected on the surface of the diffraction grating is also larger. Therefore, when it is assumed that the $\lambda^2$ is substantially constant, the bandwidth Δλ is wider as the wavelength is shorter.

In order for the bandwidth to be constant, the optical beam diameter W of the incident light is changed in accordance with the wavelength. The beam expander 31 serves to enlarge an original optical beam diameter $W_1$ of the incident light to $W_2$. The beam expander 32 serves to enlarge the optical beam diameter $W_2$ obtained via the polygon mirror 25 to $W_3$. When the enlarged optical beam diameter $W_3$ is provided for the above expression (4) as a replacement, the half-value width is determined. The optical beam diameter $W_3$ obtained by the beam expander 32 is given from the following expression when an enlargement rate is $M_2$.

$$W_3 = M_2 W_2 \quad (5)$$

The enlargement rate $M_2$ is obtained from the following expression.

$$M_2 = (\cos\phi \cdot \cos\nu)/(\cos\theta \cdot \cos\mu) \quad (6)$$

The beam expander 31 also enlarges the beam diameter in the same manner, thereby the original optical beam diameter $W_1$ is eventually enlarged to $W_3$.

Figure 8:
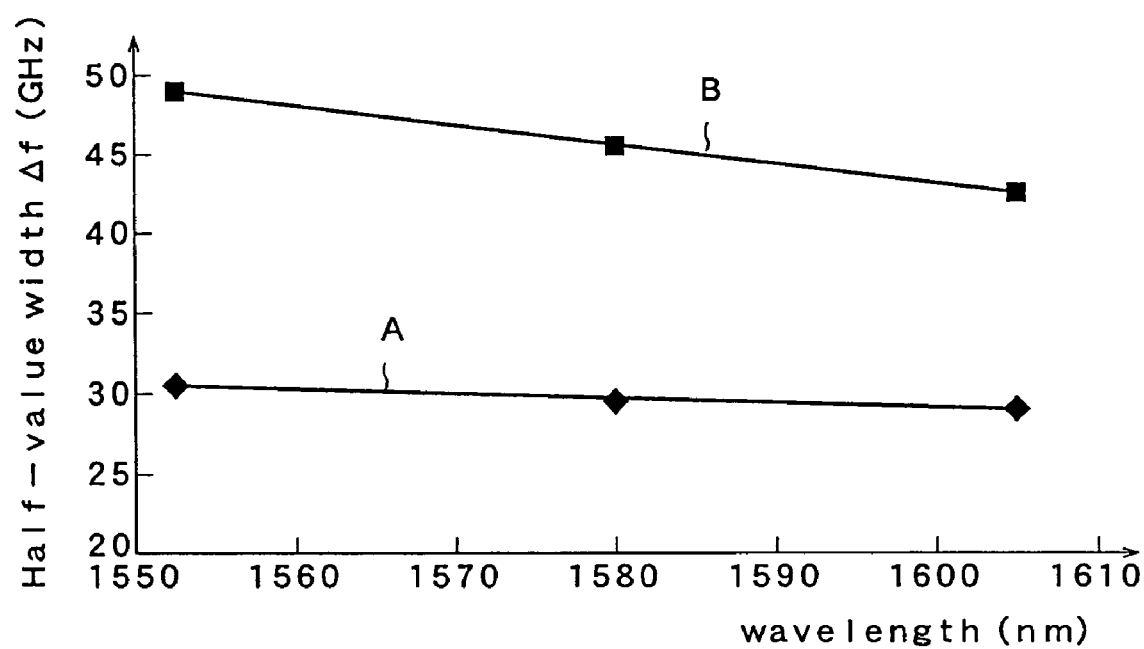
FIG. 8 is a graph showing variations relative to wavelengths of half-value width depending on the presence/absence of the beam expander.

FIG. 7 is a table showing angle variation and wavelength variation. FIG. 8 is a graph, which is drawn up based on FIG. 7, showing a variation of the half-value width (line segment A) relative to the wavelength when the beam expander 32 is used and a variation of the half-value width (line segment B) relative to the wavelength when the optical beam is directly inputted to the diffraction grating via the polygon mirror 25 without using the beam expander 32. In the graph, the bandwidth is denoted by Δf (GHz). When the beam expander is used to thereby appropriately set the angle, the bandwidth can be constantly maintained irrespective of the selected wavelength as shown in the figure.

Third Embodiment

Figure 9:
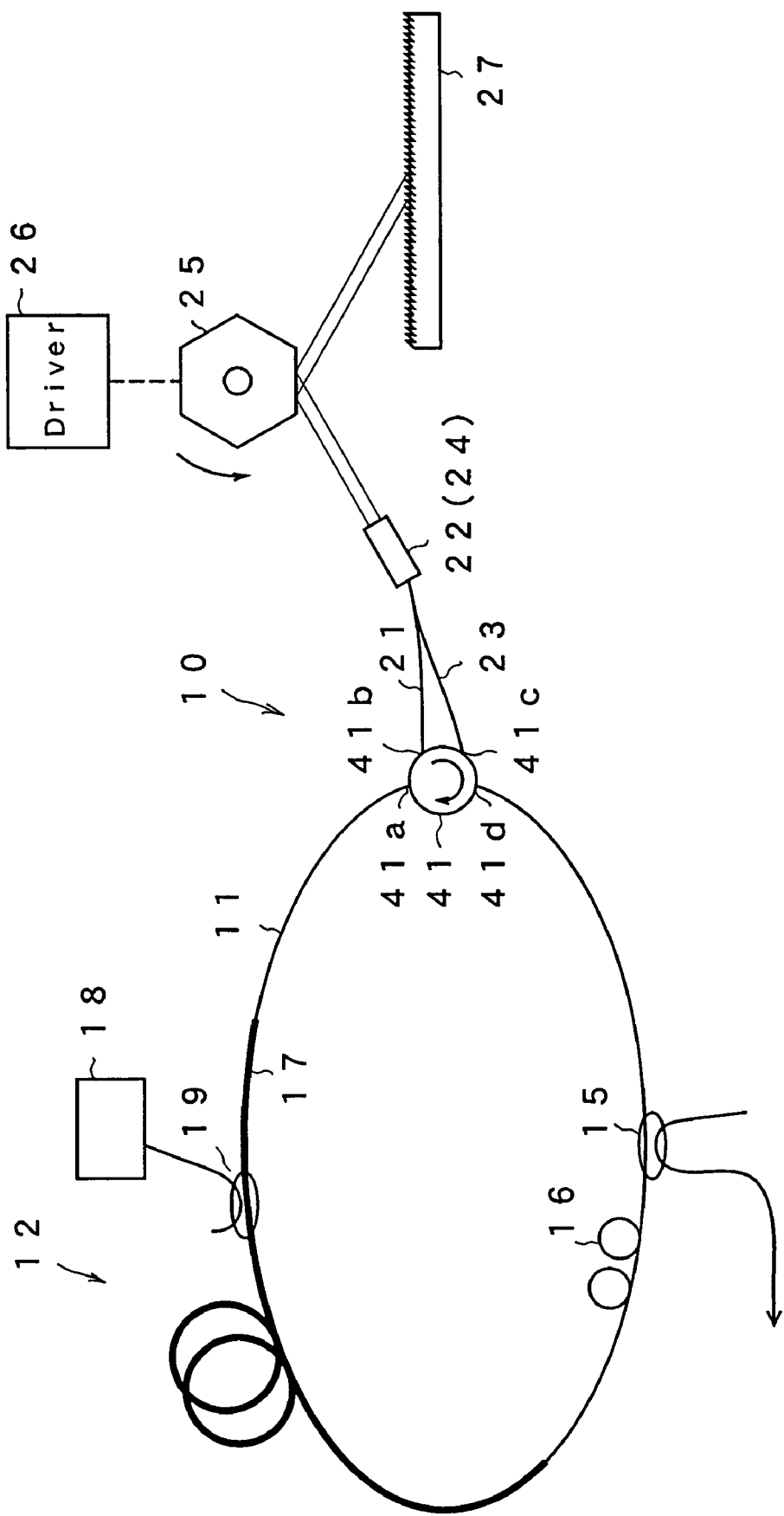
FIG. 9 is a schematic view showing a tunable fiber laser light source according to a third embodiment of the present invention.

FIG. 9 is a view showing a tunable fiber laser light source according to a third embodiment of the present invention. This embodiment uses a four-port type optical circulator as a light branch incident section in place of two three-port type optical circulators. The four-port type optical circulator 41 has terminals 41a and 41d connected to the optical fiber loop. Light inputted from the terminal 41a is emitted to a terminal 41b of the optical circulator. The light inputted from the terminal 41b is emitted from a terminal 41c. The light inputted from the terminal 41c is emitted from the terminal 41d. The light inputted from the terminal 41d is emitted from the terminal 41a. Consequently, this embodiment can use the four-port type optical circulator 41 as the light branch incident section in place of two optical circulators 13 and 14 of the first embodiment. Other construction is the same as in the first embodiment. In this case, the rotation of the polygon mirror 25 along the axis perpendicular to the paper face makes the reflected angle change, thereby allowing scanning of an oscillation wavelength.

Fourth Embodiment

Figure 10:
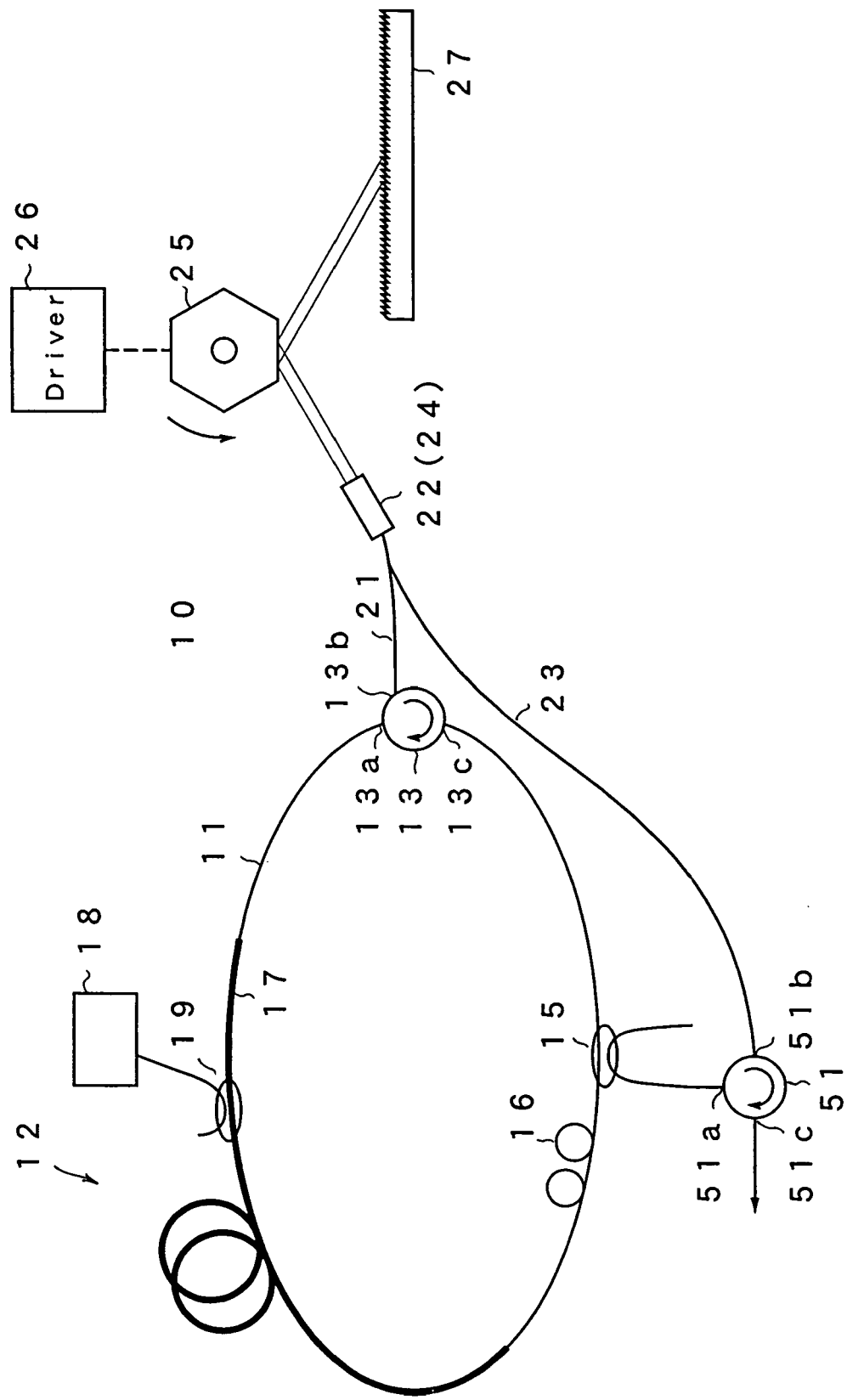
FIG. 10 is a schematic view showing a tunable fiber laser light source according to a fourth embodiment of the present invention.

FIG. 10 is a view showing a tunable fiber laser light source according to a fourth embodiment of the present invention. This embodiment inserts only the aforementioned three-port type optical circulator 13 in the optical fiber loop, and disposes a third optical circulator 51 on an output side of the optical coupler 15. Other construction is the same as in the first embodiment. That is, the optical coupler 15 takes out a part of light turning through the optical loop to input to the collimator 24 via the optical fiber 23. This allows obtaining the same effect as in the first embodiment.

Further, this embodiment may use the optical circulator 51 in addition to the two circulators 13 and 14 as in the first embodiment. Further, this embodiment may use the optical circulator 51 in addition to the four-port type optical circulator 41 as in the third embodiment to input the light into the polygon mirror. These cases can enhance wavelength selectivity by inputting three parallel optical beams into the polygon mirror 25 and the diffraction grating 27.

Fifth Embodiment

Figure 11:
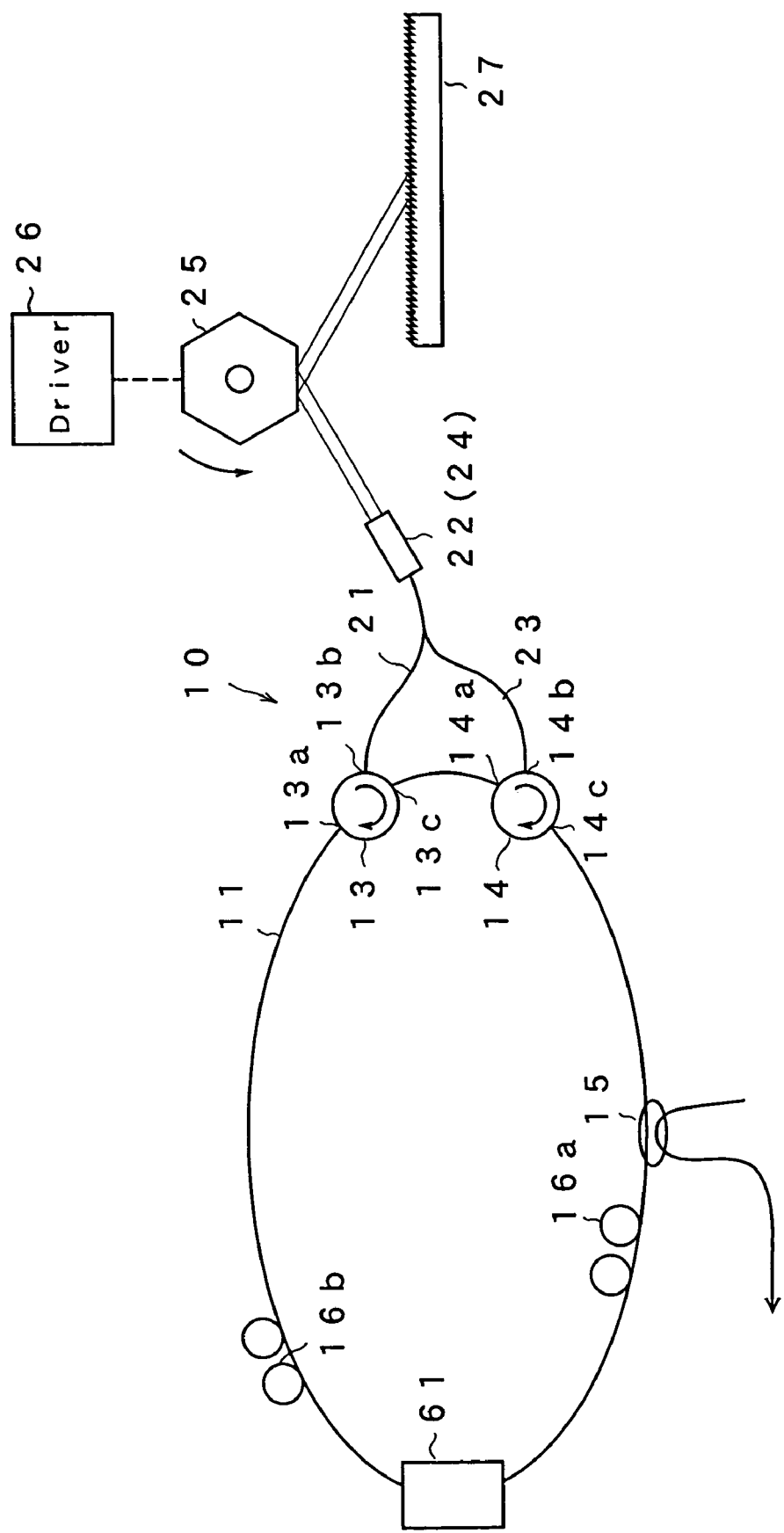
FIG. 11 is a schematic view showing a tunable fiber laser light source according to a fifth embodiment of the present invention.

FIG. 11 illustrates a tunable fiber laser light source according to a fifth embodiment of the present invention. In the present embodiment, a semiconductor optical amplifier (SOA) 61 is used as the gain medium in part of the optical fiber loop. The fiber loop is formed only by means of the regular optical fiber 11. Further, polarization controllers 16a and 16b are inserted into the fiber loop. The rest of the constitution is the same as in the first embodiment. Further, in the same manner as in the first embodiment, the optical fibers 22 and 23, collimate lenses 23 and 24, polygon mirror 25 and diffraction grating 27 are connected via the optical circulators 13 and 14. In the manner, the fiber laser oscillates can be obtained at the wavelength in response to the incident angle with respect to the diffraction grating 27 as in the above-mentioned embodiment. Then, the oscillation wavelength can be changed at high speed by rotating the polygon mirror 25. In the present embodiment, the bandwidth can be narrowed by changing the width of the optical beam in accordance with the incident angle by means of the beam expander. A gain medium 71 may be a semiconductor optical amplifier (SOA), Fabry-Perot semiconductor laser (FPLD), super luminescent laser diode (SLD) or the like.

Sixth Embodiment

Figure 12:
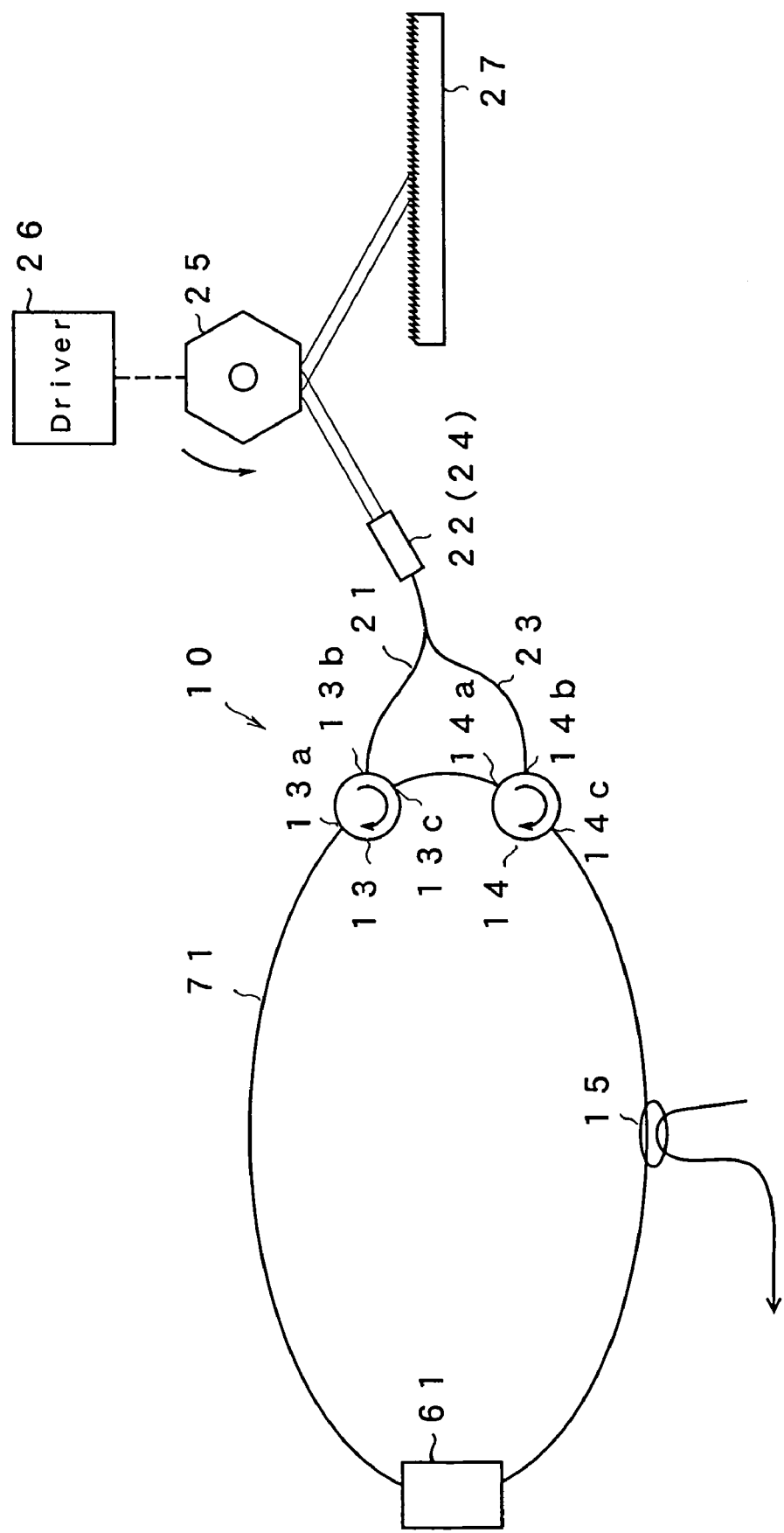
FIG. 12 is a schematic view showing a tunable fiber laser light source according to a sixth embodiment of the present invention.

FIG. 12 illustrates a tunable fiber laser light source according to a sixth embodiment of the present invention. In the present embodiment, an optical fiber 71 of a polarization maintaining type is used for the optical fiber loop to thereby form a loop of the fiber laser light source. As in the fifth embodiment, the semiconductor optical amplifier 61 is used as the gain medium in the present embodiment. Further, the optical circulators 13 and 14 and the optical coupler 16 are also used in the same manner as in the fifth embodiment. In the present embodiment, a polarization state of the light circulated in the loop and oscillated is constant in a predetermined direction because the optical fiber 71 is the polarization maintaining type fiber (PMF). The rest of the constitution is the same as in the mentioned embodiment, wherein a same effect can be obtained in a relatively simple constitution.

Seventh Embodiment

Figure 13:
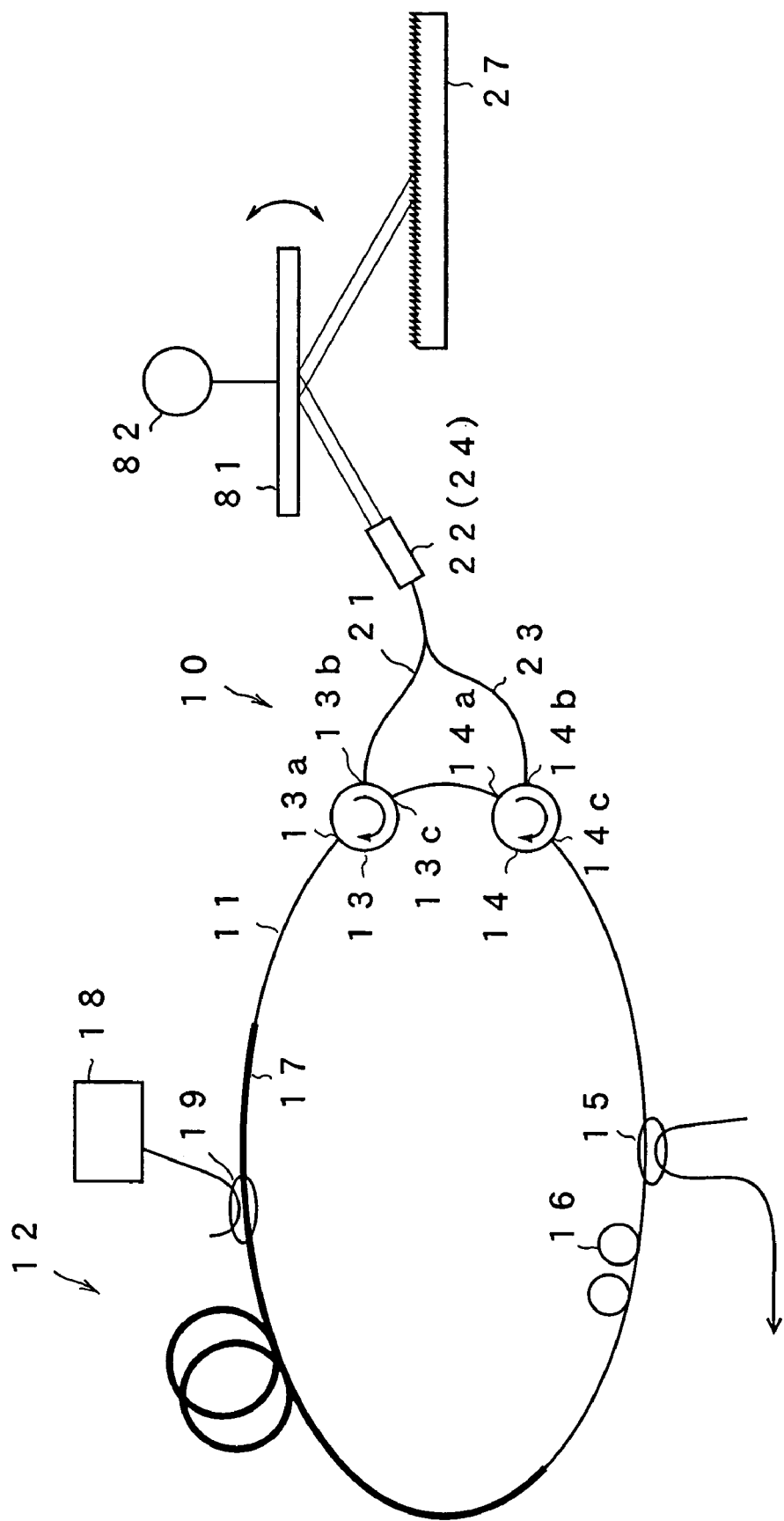
FIG. 13 is a schematic view showing a tunable fiber laser light source according to a seventh embodiment of the present invention.

Next, a seventh embodiment according to the present invention will be described with reference to FIG. 13. This embodiment uses a planar type mirror 81 and a galvanometer 82 for pivoting the mirror as the optical beam deflector. The galvanometer continuously pivots the planar type mirror 81 within a constant angle. This can deflect the optical beam to change a wavelength as in the case of using the polygon mirror. In this case, change in wavelength with respect to time is not a sawtooth waveform, but a triangular or sinusoidal waveform.

This embodiment uses two optical circulators to input light to the optical beam deflector such as the polygon mirror at the same time, but may use more than three optical circulators to collimate the light into parallel light and input to the optical beam deflector. Accordingly, the use of the same tunable filter improves wavelength selectivity.

Eighth Embodiment

Figure 14:
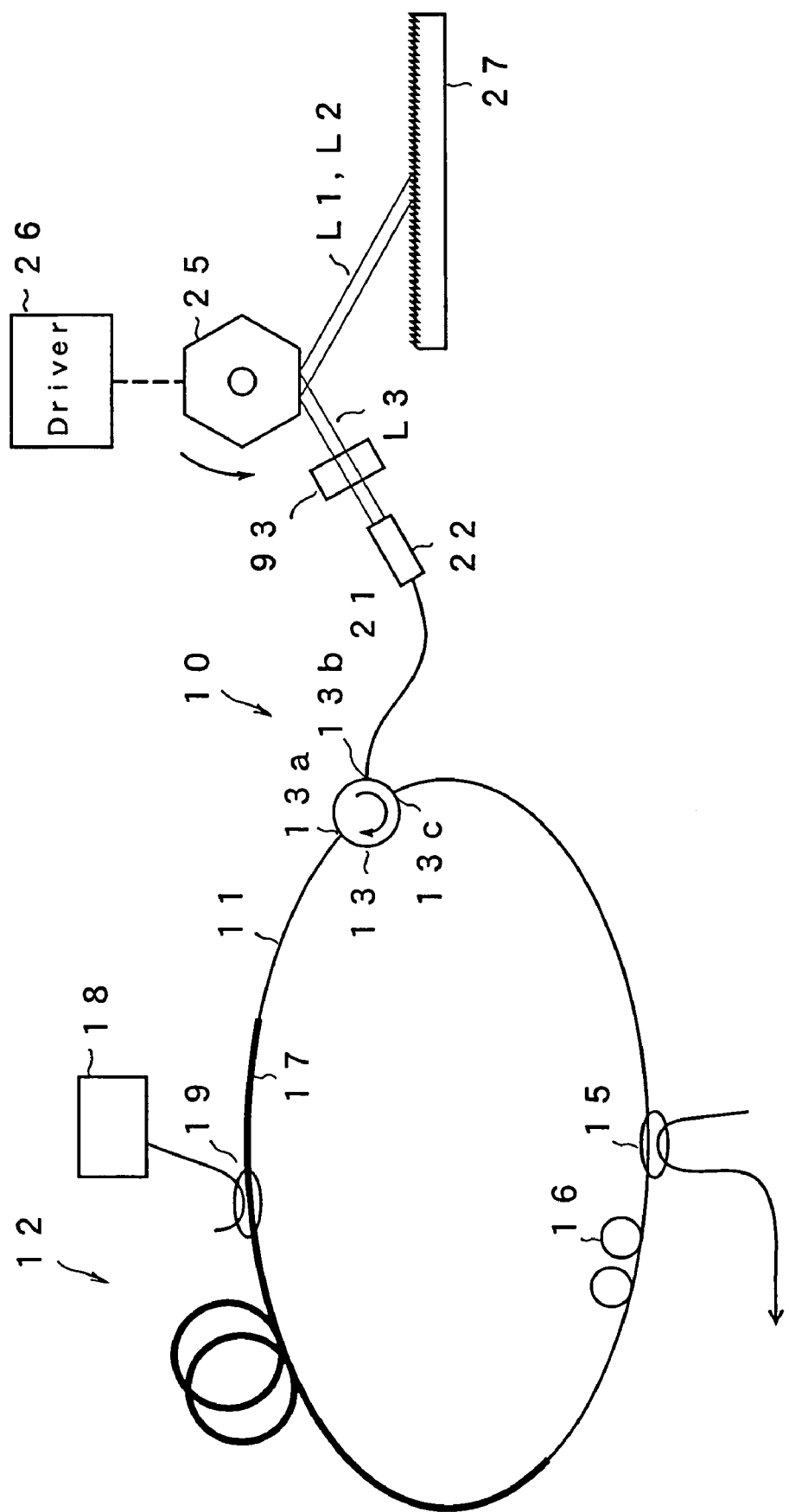
FIG. 14 is a schematic view showing a tunable fiber laser light source according to an eighth embodiment of the present invention.

Next, an eighth embodiment according to the present invention will be described with reference to FIGS. 14 and 15. This embodiment only uses the optical circulator 13 as a light branch section to input the light emitted from the optical circulator 13 into a collimate lens 22. Configuration and arrangement of the collimate lens 22, a polygon mirror 25 and a diffraction grating 27 is the same as in the first embodiment. FIG. 15 is a perspective view showing this state. This embodiment tilts an optical path of light, emitted from the collimate lens 22 to the polygon mirror 25, slightly with respect to a plane perpendicular to the Y-axis compared to the first embodiment. Then, if an optical path of light reflected at the polygon mirror 25 is a first optical path L1, the light is inputted to the diffraction grating 27 through the optical path L1. The diffraction grating 27 reflects the light of selected wavelength to a second optical path L2 which differs from the first optical path L1. The first and second optical paths L1 and L2 are the same optical path where within a plane perpendicular to the Y-axis shown in FIG. 14. In this case, as shown in FIG. 15, optical spots 91 and 92 inputted to the polygon mirror 25 are along the Y-axis. This makes the configuration the aforementioned Littrow arrangement seen from the plane perpendicular to the Y-axis shown in FIG. 14. Now, the light inputted to the polygon mirror 25 through the second optical path L2 reflects and inputs to a mirror 93 via a third optical path L3. The mirror 93 directly reflects the inputted light to the polygon mirror 25 via the third optical path L3. Accordingly, the light reflected at the polygon mirror 25 is inputted to the diffraction grating 27 again via the second optical path L2. Light of newly selected wavelength is inputted to the polygon mirror 25 via the first optical path L1, then, the light returns to the optical fiber 21 from the collimate lens 22 through the same path as the incident light. Thus the light returns to the optical fiber loop. Further, when the polygon mirror 25 rotates, the first and second optical paths L1 and L2 change, but the third optical path L3 does not change. Other configuration is the same as the aforementioned first embodiment. In this case, the light inputted to the diffraction grating also is reflected twice, resulting in improving the wavelength selectivity.

The aforementioned respective embodiments use the galvanomirror and polygon mirror as the optical beam deflector, but those that can change the reflection angle at high speed may be used and it is not to limit to those configurations.

The present invention can obtain a laser light source with a comparatively simple configuration and tunable wavelength at high speed with the use of the diffraction grating, thereby allowing for use in a medical analyzer such as a medical imaging system based on optical coherence tomography with high-resolution for lower epidermis. Further, the tunable fiber laser light source according to the present invention can be used as a light source in the case of measuring the temporal change of strain in a fiber grating sensor system.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application No. 2005-051105 filed on Feb. 25, 2005 is hereby incorporated by reference.

What is claimed is:

1. A tunable fiber laser light source comprising:
an optical fiber loop which serves as an optical path of laser oscillation;
a gain medium which is connected to said optical fiber loop and has a gain with respect to an oscillating wavelength;
a light branch incident section which divides a plurality of light beams from said optical fiber loop and returns said light beams to said optical fiber loop through the same optical path as the divided light;
a tunable optical filter which receives the plurality of divided light beams divided by said light branch incident section, selects light beams of same wavelength continuously changed, and supplies light beams of the selected wavelength said light branch incident section through the same optical path; and
an optical coupler which is connected to said optical fiber loop and takes out a part of light passing through said optical fiber loop, wherein
said tunable optical filter includes:
an optical beam deflector which is disposed on a light axis emitted from said optical fiber loop and which periodically changes a reflecting angle of an optical beam, obtained from said light branch incident section, within a certain range; and
a diffraction grating which receives light beams deflected by said optical beam deflector and reflects said light beams of selected wavelength changing according to an incident angle in the same direction as the incident angle.

2. The tunable fiber laser light source according to claim 1, wherein
said light branch incident section is of first and second three-port type optical circulators each of which has two terminals connected to said optical fiber loop.

3. The tunable fiber laser light source according to claim 1, wherein
said light branch incident section is of a four-port type optical circulator connected to said optical fiber loop, first and fourth terminals of said optical circulator are connected to said optical fiber loop, and second and third terminals of said optical circulator are connected in parallel to said tunable filter, respectively.

4. The tunable fiber laser light source according to claim 1, wherein
said light branch incident section includes:
a first optical circulator which is connected to said optical fiber loop; and
a second optical circulator which is connected to an emitting side of said optical coupler and divides a part of emitted light to input to said tunable filter.

5. The tunable fiber laser light source according to claim 1, wherein
said optical fiber loop is configured to include an optical fiber of polarization maintaining type.

6. The tunable fiber laser light source according to claim 1, wherein
said gain medium is an optical fiber amplifier which constitutes a part of said optical fiber loop.

7. The tunable fiber laser light source according to claim 1, wherein
said gain medium is a semiconductor light amplifier which amplifies light.

8. The tunable fiber laser light source according to claim 1, wherein
said optical fiber loop further includes a polarization controller which regulates a polarization direction of light passing through the optical fiber loop to a certain direction.

9. A tunable fiber laser light source comprising:
an optical fiber loop which serves as an optical path of laser oscillation;
a gain medium which is connected to said optical fiber loop and has a gain with respect to an oscillating wavelength;
a light branch incident section which divides a plurality of light from said optical fiber loop and returns light to said optical fiber loop through the same optical path as the divided light;
a tunable optical filter which receives the plurality of divided light divided by said light branch incident section, selects each same wavelength continuously changed, and supplies light of the selected wavelength said light branch incident section through the same optical path; and
an optical coupler which is connected to said optical fiber loop and takes out a part of light passing through said optical fiber loop, wherein
said tunable optical filter includes:
an optical beam deflector which periodically changes a reflecting angle of an optical beam, obtained from said light branch incident section, within a certain range; and
a diffraction grating which receives light deflected by said optical beam deflector and reflects light of selected wavelength changing according to an incident angle in the same direction as the incident angle, wherein
said optical beam deflector in said tunable optical filter includes:
a polygon mirror which is disposed on a light axis emitted from said optical fiber and has a plurality of reflecting faces for changing a light reflecting angle by rotation; and
a driver which rotates said polygon mirror for changing light reflecting angle.

10. A tunable fiber laser light source comprising:
an optical fiber loop which serves as an optical path of laser oscillation;
a gain medium which is connected to said optical fiber loop and has a gain with respect to an oscillating wavelength;
a light branch incident section which divides a plurality of light from said optical fiber loop and returns light to said optical fiber loop through the same optical path as the divided light;
a tunable optical filter which receives the plurality of divided light divided by said light branch incident section, selects each same wavelength continuously changed, and supplies light of the selected wavelength said light branch incident section through the same optical path; and
an optical coupler which is connected to said optical fiber loop and takes out a part of light passing through said optical fiber loop, wherein
said tunable optical filter includes:
an optical beam deflector which periodically changes a reflecting angle of an optical beam, obtained from said light branch incident section, within a certain range; and
a diffraction grating which receives light deflected by said optical beam deflector and reflects light of selected wavelength changing according to an incident angle in the same direction as the incident angle, wherein
said optical beam deflector in said tunable optical filter includes:

a mirror which is disposed on a light axis emitted from said optical fiber loop and changes a light reflecting angle by rotation; and a galvanometer which pivots said mirror at a certain angle range.

11. A tunable fiber laser light source comprising:

an optical fiber loop which serves as an optical path of laser oscillation;

a gain medium which is connected to said optical fiber loop and has a gain with respect to an oscillating wavelength;

a light branch incident section which divides a plurality of light from said optical fiber loop and returns light to said optical fiber loop through the same optical path as the divided light;

a tunable optical filter which receives the plurality of divided light divided by said light branch incident section, selects each same wavelength continuously changed, and supplies light of the selected wavelength said light branch incident section through the same optical path; and an optical coupler which is connected to said optical fiber loop and takes out a part of light passing through said optical fiber loop, wherein said tunable optical filter includes:

an optical beam deflector which periodically changes a reflecting angle of an optical beam, obtained from said light branch incident section, within a certain range; and a diffraction grating which receives light deflected by said optical beam deflector and reflects light of selected wavelength changing according to an incident angle in the same direction as the incident angle, wherein said tunable filter further includes a beam expander which enlarges a beam diameter of a optical beam polarized by said optical beam deflector; and said beam expander increases an enlargement rate as selected wavelength is shortened.

12. The tunable fiber laser light source according to claim 11, wherein said beam expander includes:

a first beam expander which is disposed in front of said optical beam deflector and enlarges an optical beam diameter; and a second beam expander which enlarges the optical beam diameter obtained from said first beam expander.

13. A tunable fiber laser light source comprising:

an optical fiber loop which serves as an optical path of laser oscillation;

a gain medium which is connected to said optical fiber loop and has a gain with respect to an oscillating wavelength;

a light branch incident section which divides light from said optical fiber loop, and returns light to said optical fiber loop through the same optical path as the divided light;

a tunable optical filter which receives the divided light divided by said light branch incident section, selects wavelength continuously changed, and supplies light of the selected wavelength to the light branch incident section through the same optical path; and an optical coupler which is connected to said optical fiber loop, and takes out a part of light passing through said optical fiber loop, wherein said tunable optical filter includes:

an optical beam deflector which reflects optical beam obtained from said light branch incident section, and changes a reflecting angle of the optical beam periodically within a certain range with a central focus on a axis;

a diffraction grating which receives the light deflected by said optical beam deflector passing through a first optical path, and reflects light of selected wavelength changing according to an incident angle, the reflecting light passing through a second optical path different from said the first optical path in the same direction seen from the axis of said optical beam deflector; and a mirror which reflects light reflected at said optical beam deflector passing through said second optical path and, then, inputted passing through a third optical path by return to the third optical path.

14. The tunable fiber laser light source according to claim 13, wherein said optical fiber loop is configured to include an optical fiber of polarization maintaining type.

15. The tunable fiber laser light source according to claim 13, wherein said gain medium is an optical fiber amplifier which constitutes a part of said optical fiber loop.

16. The tunable fiber laser light source according to claim 13, wherein said gain medium is a semiconductor light amplifier which amplifies light.

17. The tunable fiber laser light source according to claim 13, wherein said optical fiber loop further includes a polarization controller which regulates a polarization direction of light passing through the optical fiber loop to a certain direction.

18. The tunable fiber laser light source according to claim 13, wherein said optical beam deflector of said tunable optical filter includes:

a polygon mirror which is disposed on a light axis emitted from said optical fiber and has a plurality of reflecting faces for changing a light reflecting angle by rotation; and a driver which rotates said polygon mirror for changing light reflecting angle.

19. The tunable fiber laser light source according to claim 13, wherein said optical beam deflector in said tunable optical filter includes:

a mirror which is disposed on a light axis emitted from said optical fiber loop and changes a light reflecting angle by rotation; and a galvanometer which pivots said mirror at a certain angle range.

20. The tunable fiber laser light source according to claim 13, wherein said tunable filter further includes a beam expander which enlarges a beam diameter of a optical beam polarized by said optical beam deflector; and said beam expander increases an enlargement rate as selected wavelength is shortened.

21. The tunable fiber laser light source according to claim 20, wherein said beam expander includes:

a first beam expander which is disposed in front of said optical beam deflector and enlarges an optical beam diameter; and a second beam expander which enlarges the optical beam diameter obtained from said first beam expander.

* * * * *